(12) United States Patent
Kobayashi

(10) Patent No.: US 6,306,547 B1
(45) Date of Patent: Oct. 23, 2001

(54) PHOTOMASK AND MANUFACTURING METHOD THEREOF, AND EXPOSURE METHOD USING THE PHOTOMASK

(75) Inventor: Shinji Kobayashi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/457,531

(22) Filed: Dec. 9, 1999

(30) Foreign Application Priority Data

Dec. 16, 1998  (JP) .................................................. 10-357951

(51) Int. Cl.[7] ...................................................... G03F 9/00
(52) U.S. Cl. ............................................................. 430/5
(58) Field of Search ................................ 430/5, 322, 311; 359/586

(56) References Cited

U.S. PATENT DOCUMENTS 5,547,788   8/1996   Han et al. ................................. 430/5
5,682,226  10/1997   Anzai et al. ........................... 355/53
5,935,736 * 8/1999   Tzu ......................................... 430/5
6,010,807 * 1/2000   Lin .......................................... 430/5
6,013,395 * 1/2000   Matsuura ................................ 430/5

FOREIGN PATENT DOCUMENTS 63-18351 A   1/1988   (JP) .
6-27636 A    2/1994   (JP) .
7-49410 A    2/1995   (JP) .

* cited by examiner

Primary Examiner—S. Rosasco
(74) Attorney, Agent, or Firm—Nixon & Vanderhye P.C

(57) ABSTRACT

A transflecting portion of a photomask is given with a phase difference such that suppresses interference of exposure light exiting from the transflecting portion with light exiting from a transmitting portion. By exposing a resist to light through the photomask, a resist hole and a resist step are formed in the resist within a predetermined region (half area) in a secure manner. Consequently, by taking transmittivity and a phase difference of the transflecting portion with respect to the transmitting portion into consideration, it has become possible to provide a photomask by which a resist step is formed accurately in the resist.

22 Claims, 12 Drawing Sheets

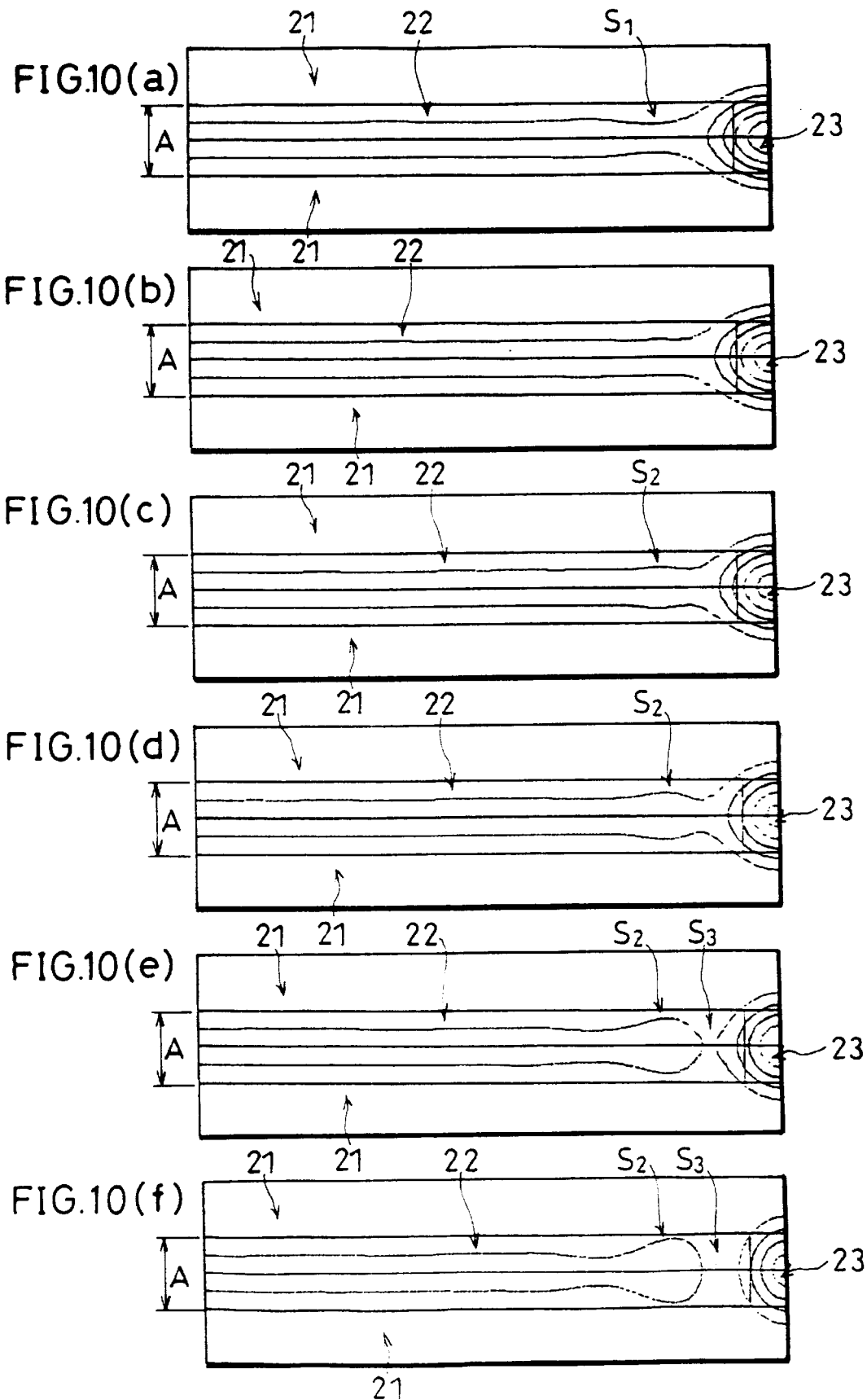

PHOTOMASK AND MANUFACTURING METHOD THEREOF, AND EXPOSURE METHOD USING THE PHOTOMASK

FIELD OF THE INVENTION

The present invention relates to a photomask employed in manufacturing a semiconductor element and a manufacturing method thereof, and to an exposure method using the photomask.

BACKGROUND OF THE INVENTION

A conventional manufacturing method of a semiconductor element uses a technique, in which, as shown in FIGS. 2(a) and 2(b), a through hole 61 and a wire groove are formed in an inter-layer insulating film 6 covering a bottom wire layer 7, so that a wire material is embedded therein.

As shown in FIG. 2(b), the inter-layer insulating film 6 has (1) a through hole area 23 which corresponds to the through hole 61, in which the inter-layer insulating film 6 is completely removed, and (2) a half area 22 in which the film thickness of the inter-layer insulating film 6 is reduced to approximately half in comparison with a surrounding area (which is referred to as a basic area 21, hereinafter). The half area 22 and basic area 21 form a step-wise shape 62 as shown in FIG. 2(a). The step-wise shape 62 is formed in the inter-layer insulating film 6 by a combination of prior arts, examples of which include the following two methods.

The first method is performed by means of half etching. In this method, as shown in FIG. 11(a), the half area 22 (see FIG. 2(b)) is exposed to light (indicated by arrows in the drawing) and developed on a wafer including a resist 5, the inter-layer insulating film 6, and the bottom wire layer 7, which are layered in vertical direction from top to bottom.

Next, as shown in FIG. 11(b), the half etching treatment is applied to the half area 22 from which the resist 5 has been removed when developed, and the inter-layer insulating film 6 is etched to approximately half the initial thickness, whereby the step-wise shape 62 is formed.

Next, as shown in FIG. 11(c), after the resist 5 is applied again, the through hole area 23 (see FIG. 2(b)) is exposed to light (indicated by arrows in the drawing) and developed. Then, as shown in FIG. 11(d), the etching treatment is applied to the inter-layer insulating film 6 in the through hole area 23, whereby the through hole 61 is formed.

The second method is performed by means of half exposure. In this method, half exposure to light (indicated by arrows in the drawing), by which the thickness of the resist 5 is reduced to approximately half the initial thickness, is effected on the half area 22 of a wafer of the identical structure as that shown in FIG. 11(a). Then, additional exposure is effected on the through hole area 23 to compensate an underexposure. Consequently, as shown in FIG. 12(b), a resist hole 101 and a resist step 102 are formed in the resist 5.

Then, as shown in FIG. 12(c), the inter-layer insulating film 6 in the through hole area 23 is removed by means of etching, whereby the through hole 61 is formed. Then, as shown in FIG. 12(d), the resist 5 in the half area 22 is removed (by means of ashing). Finally, as shown in FIG. 12(e), the step-wise shape 62 is formed in the inter-layer insulating film 6 by the half etching process.

Alternatively, available as a method of forming the step-wise shape 62 is a technique that employs an exposure and development process using a photomask furnished with transmittivity levels, in other words, a photomask having a blocking portion, a transflecting portion, and a transmitting portion.

Such a technique is disclosed in, for example, ① Japanese Laid-open Patent Application No. 18351/1988 (Japanese Official Gazette, Tokukaisho No. 63-18351, published on Jan. 26, 1988), ② Japanese Laid-open Patent Application No. 27636/1994 (Japanese official Gazette, Tokukaihei No. 6-27636, published on Feb. 4, 1994, and ③ Japanese Laid-open Patent Application No. 49410/1995 (Japanese Official Gazette, Tokukaihei No. 7-49410, published on Feb. 21, 1995).

In the technique of the disclosure ①, a translucent film made of chromium oxide (CrO) is used as the transflecting portion, and a chromium (Cr) film is used as the blocking portion. In the technique of the disclosure ②, a silicon dioxide film mixed with a light-absorbing material is used as the transflecting portion, and a triple-layer blocking film having a structure of chromium oxide/chromium/chromium oxide (CrO/Cr/CrO) is used as a blocking film. Further, in the technique of the disclosure ③, the blocking portion and transflecting portion are formed in the photomask made of a chromium compound by giving different thicknesses to the chromium compound film.

However, each of the foregoing techniques has the following problems.

The first method as a combination of prior arts is popular, but a series of processes, including the resist apply process, exposure and development process and etching process, has to be repeated twice. Thus, this method involves quite a large number of processes. For this reason, not only throughput, but also yield of devices is reduced, because dust adheres to the semiconductor element more frequently.

In the second method, the exposure and development process has to be repeated twice, but the other processes are performed only once, thereby involving fewer processes in comparison with the first method. However, because two photomasks are used in the exposure and development process, the exposure pattern of the half area 22 and that of the through hole area 23 have to be aligned accurately.

The accuracy of alignment of the exposure patterns is determined by accuracy of alignment of each photomask by means of a stepper and accuracy of relative positions of the two photomasks with respect to each other (overlapping accuracy of the photomasks). Because each accuracy has to be quite high, the accuracy of alignment can be a de-stabilizing factor in the exposure and development process.

As has been discussed, the foregoing methods demand repetitive exposure and development or highly accurate alignment of the photomasks, which complicates a process of forming the step in the inter-layer insulating film 6.

In contrast, the techniques in the disclosures ① through ③ use a single photomask including the transflecting portion in addition to the blocking portion and transmitting portion. Hence, the resist step 102 as shown in FIG. 12(b) can be formed in the resist 5 by effecting exposure and development once. Consequently, the step-wise shape 62 can be formed in the inter-layer insulating film 6 without repeating exposure and development or aligning the photomasks accurately, thereby shortening and simplifying the step forming process.

However, as far as a specific arrangement of the transmitting portion and transflecting portion formed in a single photomask is concerned, the techniques in the disclosures ① through ③ teach the transmittivity levels, but remain silent about giving a phase difference to the transflecting portion with respect to the transmitting portion.

The through holes 61 and wire grooves formed in the semiconductor element are so minute that, in order to transfer such a minute exposure pattern accurately onto the resist 5 through the photomask having the transmittivity levels, a phase difference of the transflecting portion with respect to the transmitting portion has to be controlled. For this reason, the techniques in the disclosures ① through ③ share a problem that the resist step 102 can not be formed in the resist 5 as desired in a reliable manner.

SUMMARY OF THE INVENTION

It is therefore an object of the present invention to provide (1) a photomask, by which a resist step is formed in a resist accurately with transmittivity and a phase difference of a transflecting portion with respect to a transmitting portion being taken into consideration; (2) a manufacturing method of the photomask; and (3) an exposure method using the photomask.

To fulfill the above and other objects, a photomask of the present invention is characterized by having:

a high transmitting portion which transmits light to reach a resist;

a low transmitting portion having transmittivity lower than transmittivity of the high transmitting portion, the low transmitting portion being arranged so as to generate a phase difference between light exiting from the high transmitting portion and light exiting from the low transmitting portion to suppress interference of light therebetween.

According to the above arrangement, light is irradiated to the resist through the high transmitting portion and low transmitting portion in the photomask, and a step is formed in the resist due to a difference in transmittivity between the high transmitting portion and low transmitting portion in the photomask.

A conventional photomask includes portions having high transmittivity and low transmittivity, and uses a difference in transmittivity to form a step in the resist.

However, today's technique demands that an extraordinarily minute step be formed as a through hole or a wire groove in a semiconductor element, for example. The arrangement of the conventional photomask which considers only a difference in transmittivity can not meet such a demand to form an extraordinarily minute step accurately in the resist.

The reason why is as follows. That is, if light exiting from the high transmitting portion and light exiting from the low transmitting portion are in-phase on the resist, light irradiated onto the resist intensifies. On the other hand, if these two kinds of light have different phases from each other, light intensity is reduced. If light intensity varies on the resist by interference of light in the above manner, a resist residue or a resist loss is produced, thereby making it impossible to form a desired step in the resist.

However, according to the arrangement of the present invention, the low transmitting portion is arranged in such a manner so as to generate a phase difference between light exiting from the high transmitting portion and light exiting from the low transmitting portion, so that interference of light is suppressed. Thus, because variance in light intensity caused by interference of light can be suppressed, a minute step can be formed accurately in the resist without producing a resist residue or a resist loss.

Also, in order to fulfill the above and other objects, a method of manufacturing a photomask of the present invention is characterized by having:

a step (a) of forming a low transmitting film on a high transmitting substrate, transmittivity of the low transmitting film being lower than transmittivity of the high transmitting substrate; and a step (b) of removing a part of the low transmitting film to let the high transmitting substrate be exposed, thereby forming a high transmitting portion, the low transmitting film being formed in the step (a) in such a manner that a phase difference is generated between light exiting from the high transmitting portion and light exiting from the low transmitting film so as to suppress interference of light therebetween.

According to the above method, the low transmitting film is formed on the high transmitting substrate in such a manner so as to generate a phase difference between light exiting from the high transmitting portion in the high transmitting substrate and light exiting from the low transmitting film, so that interference of light is suppressed. Thus, because variance in light intensity caused by interference of light can be suppressed, a minute step can be formed accurately in the resist without producing a resist residue or a resist loss.

In order to fulfill the above and other objects, a method of exposing a resist to light of the present invention is characterized by using a photomask having:

a high transmitting portion which transmits light to reach a resist; and a low transmitting portion having transmittivity lower than transmittivity of the high transmitting portion, the low transmitting portion being arranged so as to generate a phase difference between light exiting from the high transmitting portion and light exiting from the low transmitting portion to suppress interference of light therebetween.

According to the above method, the resist is exposed to light through the photomask having the high transmitting portion which transmits light to reach the resist, and the low transmitting portion having transmittivity lower than that of the high transmitting portion, in which the low transmitting portion is arranged to generate a phase difference between light exiting from the high transmitting portion and low transmitting portion, so that interference of light is suppressed. Thus, because variance in light intensity caused by interference of light can be suppressed, a minute step can be formed accurately in the resist without producing a resist residue or a resist loss.

For a fuller understanding of the nature and advantages of the invention, reference should be made to the ensuing detailed description taken in conjunction with the accompanying drawings.

BRIEF DESCRIPTION OF THE DRAWINGS

FIG. 1(*b*) is a graph showing light intensity distribution of exposure light through the photomask of FIG. 1(*a*);

FIG. 1(*c*) is a cross section showing an arrangement of a resist formed when exposed to light through the photomask; and FIG. 1(*d*) is a plan view of the resist of FIG. 1(*c*).

FIG. 2(*b*) is a plan view of the inter-layer insulating film of FIG. 2(*a*).

FIGS. 10(a) through 10(f) are views explaining light intensity distribution of exposure light when the phase difference is varied while 15% is given as transmittivity of the transflecting portion in the photomask of FIG. 1(a).

DESCRIPTION OF THE EMBODIMENTS

Figure 1A:
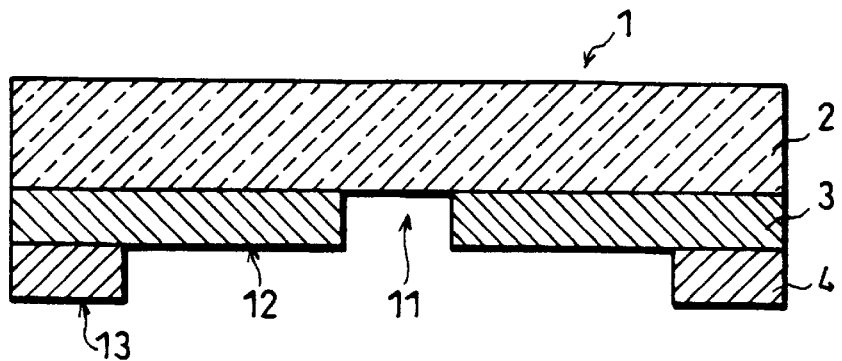
FIG. 1(*a*) is a cross section showing an arrangement of a photomask in accordance with one embodiment of the present invention.

Referring to FIGS. 1(a)–1(d) through FIGS. 10(a)–10(f), the following description will describe one embodiment of the present invention. It should be appreciated, however, that the present invention is not limited to the following disclosure.

A photomask of the present invention is employed to form a resist step (step) in a resist by effecting exposure and development once to further form a step-wise shape in an inter-layer insulating film of a semiconductor element.

Thus, a single photomask includes a transmitting portion which transmits exposure light at high transmittivity, a transflecting portion having smaller transmittivity than in the transmitting portion, and a blocking portion which substantially blocks exposure light. Additionally, a phase difference of the transflecting portion with respect to the transmitting portion is optimized so as to suppress interference of exposure light exiting from the transflecting portion with exposure light exiting from the transmitting portion.

In the first place, the following will explain how the inter-layer insulating film is formed in the semiconductor element. In case of a wafer having the inter-layer insulating film formed over the bottom wire layer 7 as shown in FIG. 2(a), a through hole 61 is made in the inter-layer insulating film 6 to let the bottom wire layer 7 be exposed, and a step-wise shape 62, which will be used as the wire groove, is formed in the circumference. The step-wise shape 62 includes at least an area where the inter-layer insulating film 6 is as thick as the initial film thickness and an area where the inter-layer insulating film 6 is of approximately half the thickness of the initial film thickness.

Hereinafter, as shown in FIG. 2(b), the area having the initial film thickness is referred to as a basic area 21 and the area having half the initial film thickness is referred to as a half area 22. Also, an area corresponding to the through hole 61 is referred to as a through hole area 23.

The step-wise shape 62 is formed in the inter-layer insulating film 6 by means of etching with a resist. However, in order to transfer a resist pattern of the step-wise shape 62 accurately onto the resist, a photomask having at least three levels of transmittivity is used. The following will explain how the step-wise shape 62 is formed using such a photomask.

Figure 3A:
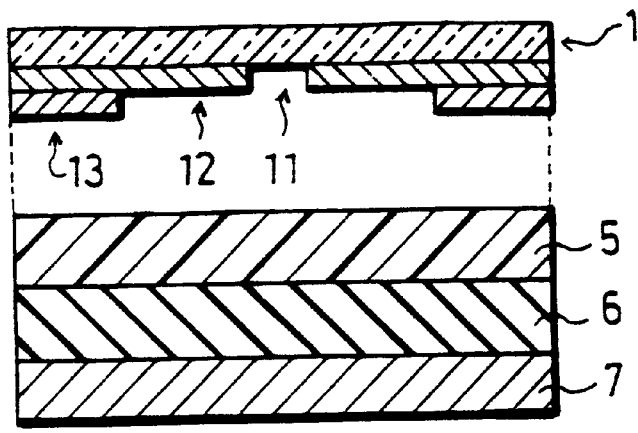
FIGS. 3(*a*) through 3(*e*) are views explaining a procedure along which a step-wise shape and a through hole are formed in the inter-layer insulting film by using the photomask of FIG. 1(*a*).
Figure 3B:
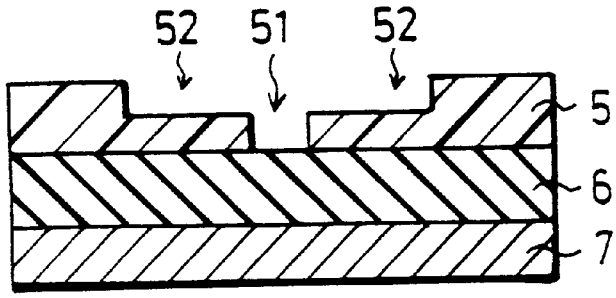

As shown in FIG. 3(a), a layer of the resist 5 is formed over the inter-layer insulating film 6 which has been layered over the bottom wire layer 7 thereby to form the wafer, and the resist 5 is exposed to light through the photomask 1. The photomask 1 has a transmitting portion 11, a transflecting portion 12, and a blocking portion 13. When developed subsequently, the resist 5 has a resist hole 51 and a resist step 52 as shown in FIG. 3(b).

The blocking portion 13 corresponds to the basic area 21, in which the resist 5 over the wafer is left intact. The transflecting portion 12 corresponds to the half area 22, in which a film thickness of the resist 5 is reduced to approximately half the initial thickness when developed. The resist step 52 is formed by the half area 22. The transmitting portion 11 corresponds to the through hole area 23, in which the resist 5 is completely removed, thereby forming the resist hole 51.

Figure 3C:
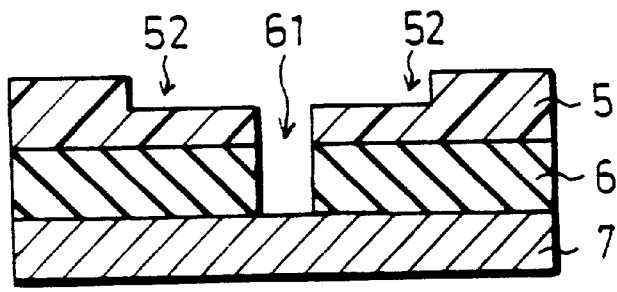
Figure 3D:
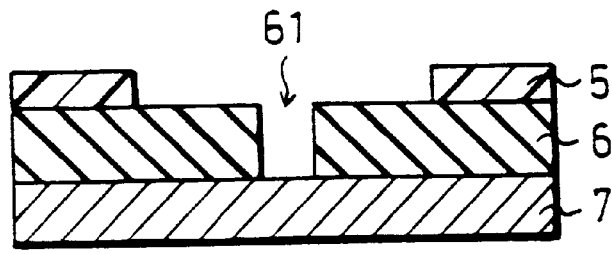
Figure 3E:
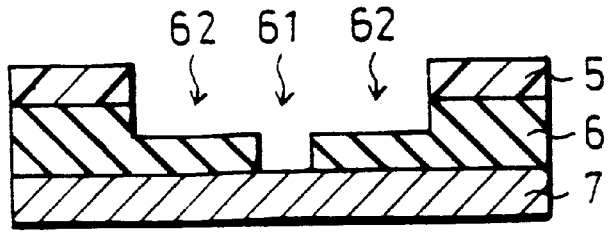

Then, as shown in FIG. 3(c), the resist hole 51 (through hole area 23) is etched, whereby the inter-layer insulating film 6 is removed to let the bottom wire layer 7 be exposed, thereby forming the through hole 61. Then, as shown in FIG. 3(d), the resist 5 in the half area 22 is removed (by means of ashing). Finally, as shown in FIG. 3(e), the inter-layer insulating film 6 in the half area 22 is etched to half the initial thickness in the half etching process, whereby the step-wise shape 62 is formed in the inter-layer insulating film 6.

As has been discussed, in order to form the step-wise shape 62 in the inter-layer insulating film 6, it is essential to form the resist step 52 at the half area 22 in the resist 5 which is used as a masking material during etching.

It should be noted that, in order to form the resist step 52 in the half area 22, the photomask 1 is arranged in such a manner that transmittivity of the transflecting portion 12 is set strictly with respect to that of the transmitting portion 11. In other words, assume that, with transmittivity of the transmitting portion 11, exposure light exiting therefrom attains light intensity such that the resist 5 is removed completely, then transmittivity of the transflecting portion 12 is set so that exposure light exiting therefrom attains light intensity such that the resist 5 is etched to half the initial thickness.

However, the resist step 52 can not be formed accurately in the resist 5 by merely setting transmittivity of the transflecting portion 12 with respect to that of the transmitting portion 11. A phase difference must be also set in the transflecting portion 12 with respect to the transmitting portion 11.

Figure 4A:
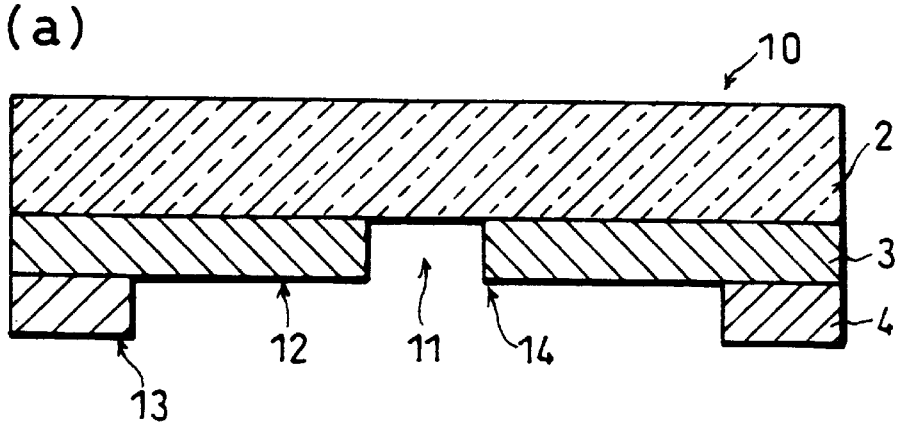
FIG. 4(a) is a cross section showing an arrangement of a photomask given with a different phase difference from that given to the photomask of FIG. 1(a)

The following will explain how the phase difference is set with reference to FIG. 4(a) which illustrates a case where the resist is exposed to light through a photomask 10, in which approximately 180° is given as the phase difference of the transflecting portion 12 with respect to the transmitting portion 11.

As shown in FIG. 4(a), the photomask 10 has a triple-layer structure including a transparent substrate 2, and a double-layer film including the translucent film 3 and blocking film 4, all of which are layered in this order in a vertical direction. An exposed portion of the transparent substrate 2 is the transmitting portion 11, and an exposed portion of the translucent film 3 covering the transparent substrate 2 is the transflecting portion 12. Also, a portion of the blocking film 4 covering the transparent substrate 2 and translucent film 3 is the blocking portion 13.

As has been explained, transmittivity of the transflecting portion 12 is set to attain light intensity $e_o$ at which the film thickness of the resist 5 is reduced to approximately half the initial thickness when exposed to light through the translucent film 3. However, a phase difference with respect to the transmitting portion 11 (transparent substrate 2) is not particularly concerned herein.

Figure 4B:
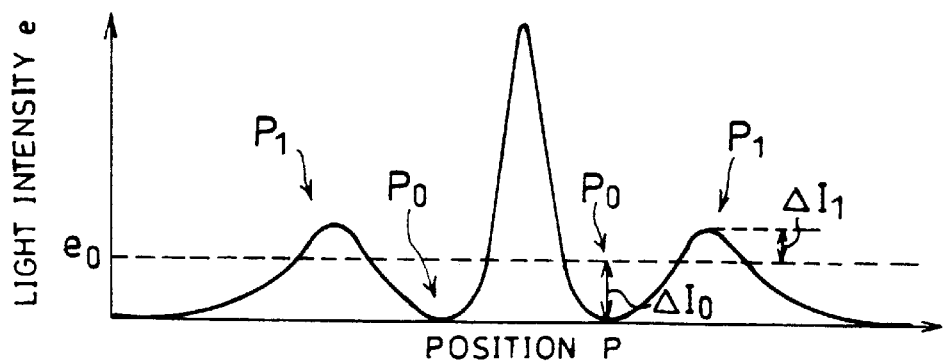
FIG. 4(b) is a graph showing light intensity distribution of exposure light through the photomask of FIG. 4(a)

If approximately 180° is given as the phase difference of the translucent film 3 of the transflecting portion 12 with respect to the transparent substrate 2 of the transmitting portion 11, then the anti-phase light interference effect develops a portion with a zero light intensity on a boundary 14 of the transmitting portion 11 and transflecting portion 12. To be more specific, in a graph showing light intensity distribution which uses light intensity e as the ordinate and a given point P on the wafer as the abscissa, a point $P_0$, with a zero light intensity appears on the boundary 14 as shown in FIG. 4(b). For this reason, if the resist 5 is exposed to light and developed through the photomask 10, as shown in the cross section of the resist in FIG. 4(c), a resist residue 53 is produced at a position corresponding to the point $P_0$ due to the zero light intensity.

Figure 4C:
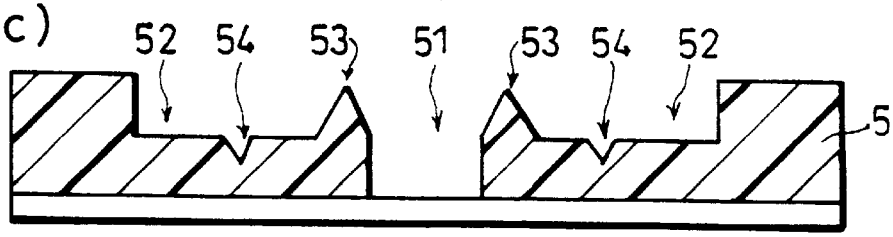
FIG. 4(c) is a cross section showing an arrangement of a resist formed when exposed to light through the photomask of FIG. 4(a)

In addition, light intensity reaches a secondary peak $P_1$, at a point where primary diffracted light from the transparent substrate 2 in the transmitting portion 11 and light exiting from the translucent film 3 in the transflecting portion 12 are in-phase (having the same phase) and interfere with each other (in the drawing, somewhere in the middle between the short side of the rectangular half area 22 and the resist hole 51 at the center). For this reason, as shown in FIG. 4(c), at a position corresponding to the secondary peak $P_1$, the layer thickness of the resist 5 is reduced more than desired and a resist loss 54 is produced.

In other words, even when transmittivity of the translucent film 3 is set so as to give adequate light intensity $e_0$ as indicated by a broken line in FIG. 4(b), if a phase difference is not given to the translucent film 3 in the transflecting portion 12 with respect to the transparent substrate 2 in the transmitting portion 11, unwanted light intensity differences, that is, a light intensity difference $\Delta I = \Delta I_0$ at the point $P_0$ and a light intensity difference $\Delta I = \Delta I_1$, at the secondary peak $P_1$, are produced.

Thus, if a phase difference is not concerned, the photomask 10 is exposed to light with a light intensity difference up to $\Delta I_0 + \Delta I_1$ on the translucent film 3. Consequently, as shown in FIG. 4(d), the resist step 52 is not formed accurately in the resist 5 by means of exposure and development using the photomask 10.

Figure 4D:
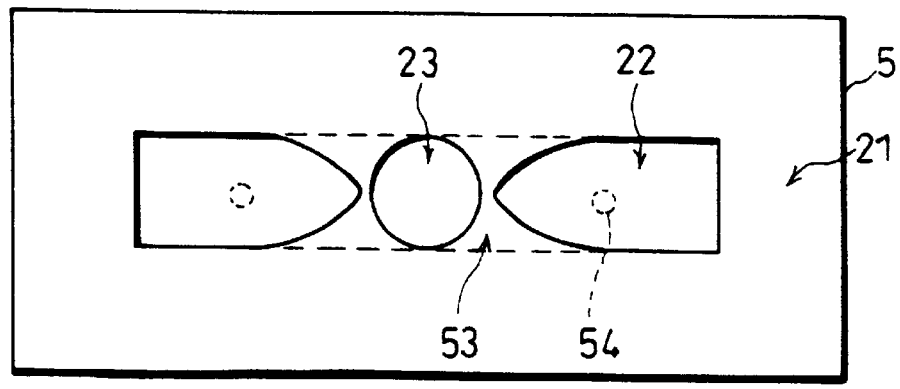
FIG. 4(d) is a plan view of the resist of FIG. 4(c).

Ideally, the resist step 52 in FIG. 4(d) is surrounded by the basic area 21 within the half area 22 which will shape a substantially rectangular area including the portion indicated by broken lines. However, the resist residue 53 having a thickness of greater than half the initial thickness is left at the position corresponding to the point $P_0$ around the through hole area 23, and the resist loss 54 is produced at the position corresponding to the secondary peak $P_1$ (in the drawing, a circle indicated by a broken line).

Therefore, even if optimal transmittivity is given to the transflecting portion 12 with respect to that of the transmitting portion 11, the resist 5 having the accurate resist step 52 can not be formed unless the phase difference of the transflecting portion 12 with respect to the transmitting portion 11 is taken into consideration. If the resist step 52 is not formed accurately, the half area 22 is not formed in the inter-layer insulating film 6 accurately either, thereby making it impossible to form the inter-layer insulating film 6 having the step-wise shape 62 as desired.

In order to solve the above inconveniences, the photomask 1 of the present invention includes the transflecting portion 12 in which not only transmittivity, but also a phase difference with respect to the transmitting portion 11 is set properly. In other words, the transflecting portion 12 is arranged in such a manner so as to produce a phase difference between light exiting from the transmitting portion 11 and light exiting from the transflecting portion 12 to suppress interference of light. In short, a refractive index and a film thickness of the transflecting portion 12 are set so that a phase difference which satisfies the foregoing is produced.

Thus, with the photomask 1 of the present invention, by controlling the phase difference between the transflecting portion 12 and transmitting portion 11 provided to the transparent substrate 2, adequate light intensity is obtained across the transflecting portion 12 without being affected adversely by the transmitting portion 11, thereby making it possible to form a desired resist pattern.

As shown in FIG. 1(a), the photomask 1 adopts a triple-layer structure (transparent substrate 2, translucent film 3, and blocking film 4) as does the photomask 10. An exposed portion of the transparent substrate (high transmitting substrate) 2 is the transmitting portion (high transmitting portion) 11, and an exposed portion of the translucent film (low transmitting film) 3 covering the transparent substrate 2 is the transflecting portion (low transmitting portion 12). Also, a portion of the blocking film 4 covering the transparent substrate 2 and translucent film 3 is the blocking portion 13.

Transmittivity is given to the transflecting portion 12 so that suitable light intensity $e_0$ is attained. In addition, the phase difference of the transflecting portion 12 with respect to the transmitting portion 11 is optimized. In the present invention, in order to form the resist step 52 in the resist 5 in a secure manner, the phase difference is given so as to suppress interference of exposure light exiting from the translucent portion 12 with exposure light exiting from the transmitting portion 11.

Figure 1B:
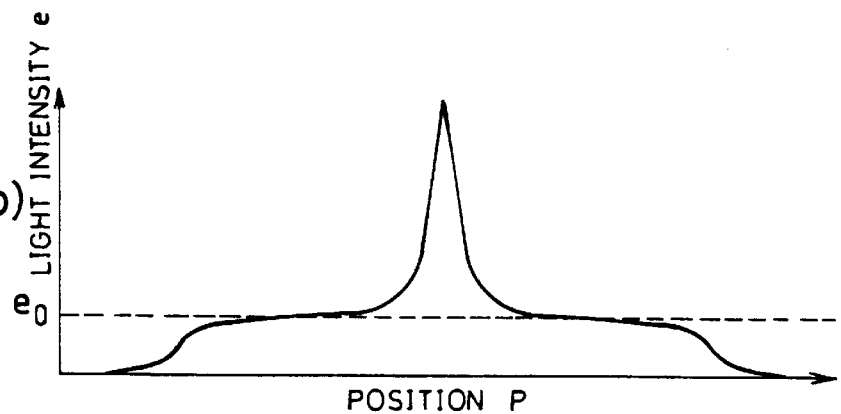

For this reason, as shown in the graph of light intensity distribution of FIG. 1(b), adequate light intensity $e_0$ is given as transmittivity across the transflecting portion 12. In other words, in the translucent film 3, exposure light exiting from each portion hardly interferes with each other. Thus, unlike the photomask 10 generating a light intensity difference of $\Delta I = \Delta I_0 + \Delta I_1$, a light intensity difference $\Delta I$ is almost 0 (zero).

Figure 1C:
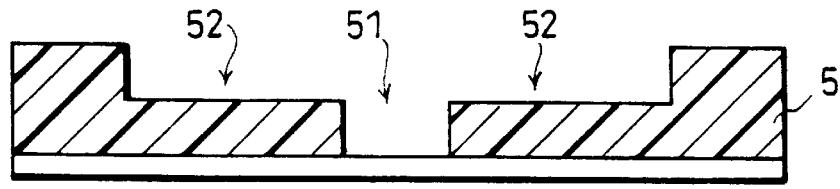

Thus, if the resist 5 is exposed to light and developed through the photomask 1, as is shown in the cross section of FIG. 1(c), the resist residue 53 and resist loss 54 around the resist hole 51 in the half area 22 can be avoided.

Consequently, in the half area 22, the film thickness of the resist 5 is reduced to approximately half the initial thickness, thereby forming the resist step 52 as desired.

Figure 1D:
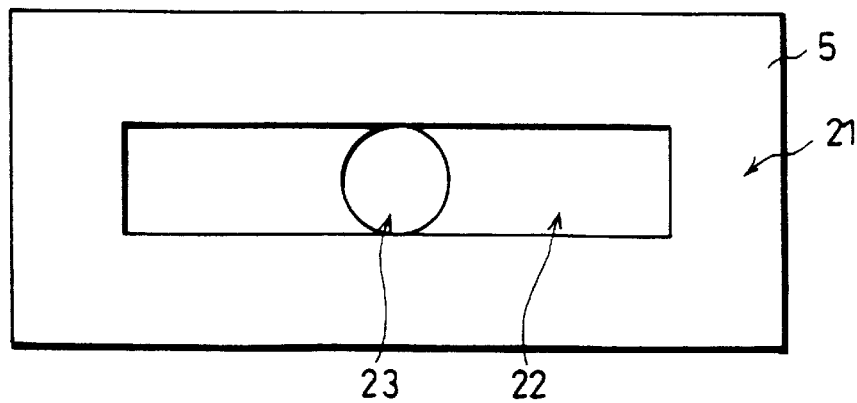

Moreover, as shown in the plan view of the resist 5 in FIG. 1(d), the half area 22 is formed in accordance with a resist pattern which is substantially true to the exposure pattern formed on the photomask 1. In other words, the half area 22 is formed as a rectangular area surrounded by the basic area 21, and the through hole area 23 is formed at the center to make contact with the basic area 21. Thus, the resist step 52 can be formed in the resist 5 efficiently in a reliable manner.

The etching treatment and ashing treatment are applied to the resist 5 in which the resist step 52 has been formed in the above manner, whereby the inter-layer insulating film 6 is formed with the step-wise shape 62 and half area 22 as desired as shown in FIGS. 2(a) and 2(b)

With the transflecting portion 12, transmittivity and phase difference for avoiding the resist residue 53 and resist loss 54 as shown in FIGS. 4(c) and 4(d) are not especially limited to specific values. These values vary from time to time depending on, for example, a light source of an exposure device used in the exposure process, performance of materials used as the resist 5, and the layer thickness of the resist 5.

Transmittivity and phase difference of the transflecting portion 12 may vary concurrently depending on the film thickness of the translucent film 3. For this reason, it is particularly preferable to set the film thickness of the translucent film 3 when determining the transmittivity and phase difference of the transflecting portion 12.

For example, in the present embodiment, oxygen nitride ($MoSiO_xN_y$) of molybdenum silicide is used as the translucent film 3 as will be described below. Here, the transmittivity of the transflecting portion 12 is preferably in a range between 10% and 30%, and most preferably at or around 15% of the transmittivity of the transmitting portion 11. Also, the phase difference of the transflecting portion 12 with respect to the transmitting portion 11 is preferably in a range between 50° and 70°, and most preferably at or around 600. The transmittivity and phase difference of the transflecting portion 12 will be discussed more in detail below.

With the photomask 1 of the present invention, it is more preferable to adjust the size of the exposure pattern including the transflecting portion 12 and blocking portion 13 besides giving adequate transmittivity and phase difference to the transflecting portion 12 with respect to the transmitting portion 11. In other words, it is more preferable that the transmitting portion 11 is of a shape adjusted in accordance with shift of light exiting from the transmitting portion 11, which is caused by a transmittivity difference between the transmitting portion 11 and transflecting portion 12.

For example, in order to form the through hole 61 and step-wise shape 62 in the inter-layer insulating film 6, assume that the rectangular half area 22 surrounded by the basic area 21 and the through hole 61 at the center of the half area 22 that makes contact with the basic area 21 are formed by an exposure pattern used herein. Then, with this photomask 1, the basic area 21 corresponds to the blocking portion 13, the half area 22 to the transflecting portion 12, and the through hole 61 to the transmitting portion 11.

Figure 5A:
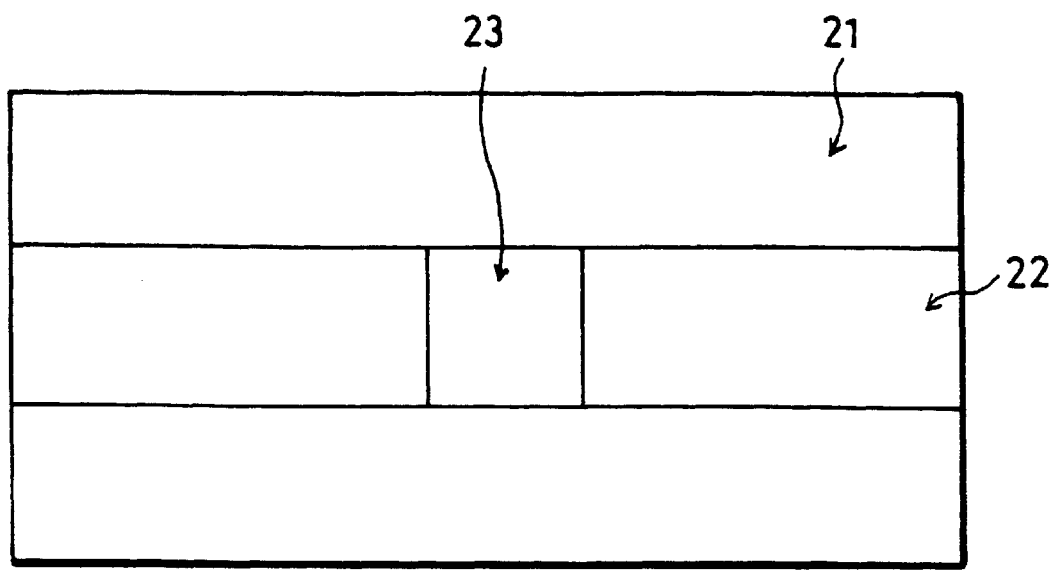
FIG. 5(a) is a view schematically showing an exposure pattern when shift of a through hole area during exposure is not concerned in the photomask of FIG. 1(a)
Figure 5B:
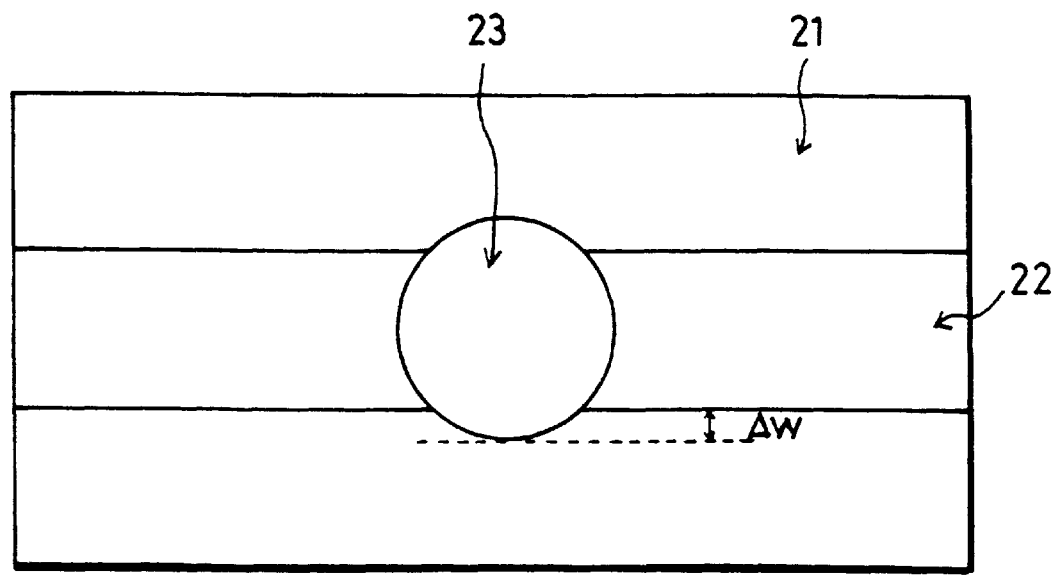
FIG. 5(b) is a view schematically showing an actual resist pattern developed with the exposure pattern of FIG. 5(a).

However, if the resist 5 formed over the inter-layer insulating film 6 is exposed to light and developed through the photomask 1 as shown in FIG. 3(a), then a transmittivity difference between the transflecting portion 12 and transmitting portion 11 causes shift of the resist pattern on the wafer as shown in FIG. 5(b), thereby making it impossible to obtain a desired resist pattern true to the exposure pattern.

To be more specific, as shown in FIG. 5(b), the through hole area 23 should be formed to make contact with the basic area 21, but exposure light is irradiated to a larger area and the through hole area 23 shifts in such a manner to invade into the basic area 21 by a width $\Delta W$ (which is referred to as the shift width $\Delta W$). When the shift width $\Delta W$ is generated, the through hole area 23 is oversized than its ideal size shown in FIG. 5(a), thereby making it impossible to form the through hole 61 as desired in the inter-layer insulating film 6.

To solve this problem, the photomask 1 of the present invention is arranged in such a manner that the shape of the transmitting portion 11 is made different from the shape actually formed by exposure light exiting therefrom in accordance with shift (shift width $\Delta W$) of the exposure light exiting from the transmitting portion 11, which is caused by a transmittivity difference between the transmitting portion 11 and transflecting portion 12. In the present embodiment, as shown in FIG. 6(a), the size of the through hole area 23 is set smaller than the half area 22.

Because the through hole area 23 corresponds to the transmitting portion 11 of the photomask 1, it transmits exposure light at higher transmittivity than the half area 22 corresponding to the transflecting portion 12, and this is the reason why the shift width $\Delta W$ is generated at the time of exposure. By taking this event into consideration, the size of the transmitting portion 11 (through hole area 23) is reduced by $\Delta M$ (reduced width $\Delta M$) in accordance with the shift width $\Delta W$.

Figure 6:
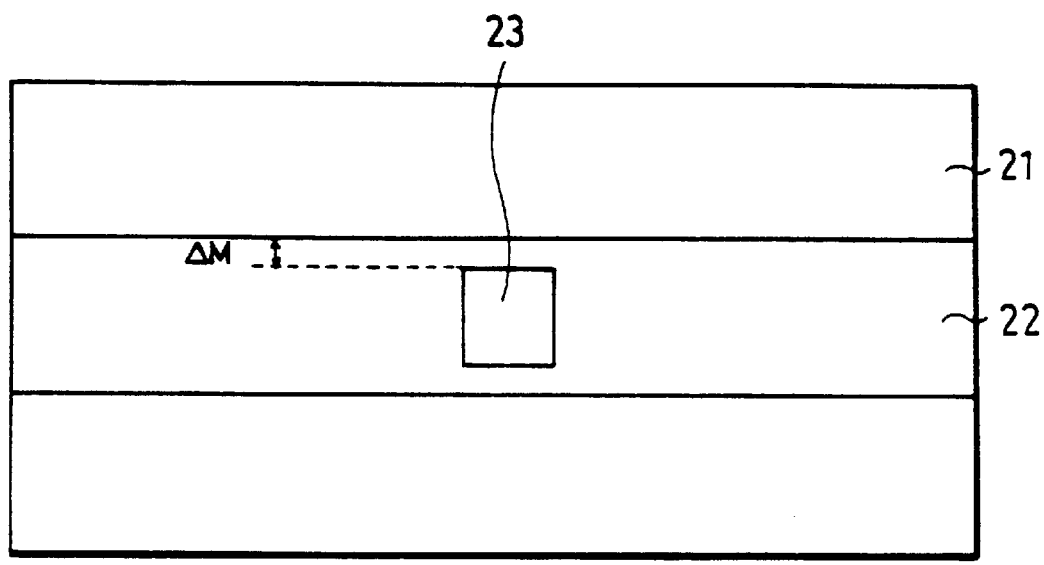
FIG. 6(a) is a view schematically showing an exposure pattern when shift of the through hole area during exposure is concerned in the photomask of FIG. 1(a)
FIG. 6(b) is a view schematically showing an actual resist pattern developed by the exposure pattern of FIG. 6(a).
Figure 6:
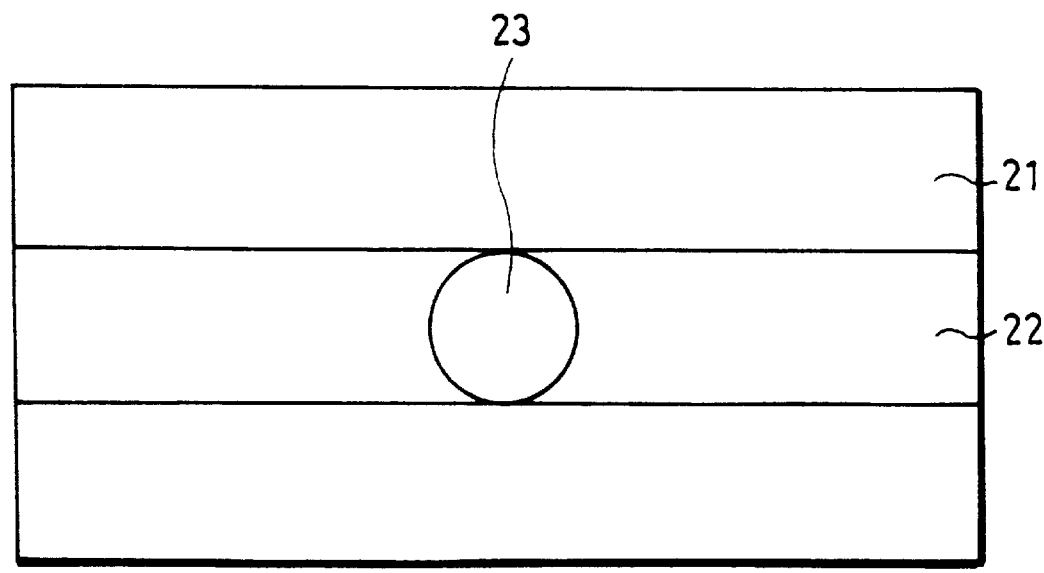

Accordingly, as shown in FIG. 6(b), it has become possible to form a desired resist pattern (the resist pattern having the through hole area 23 that makes contact with the basic area 21), which is almost identical to the ideal exposure pattern shown in FIG. 5(a). It should be noted that, because the shift width $\Delta W$ is a parameter that varies from time to time depending on the arrangements of the photomask 1 and exposure device, it is not limited to a specific value.

Figure 7:
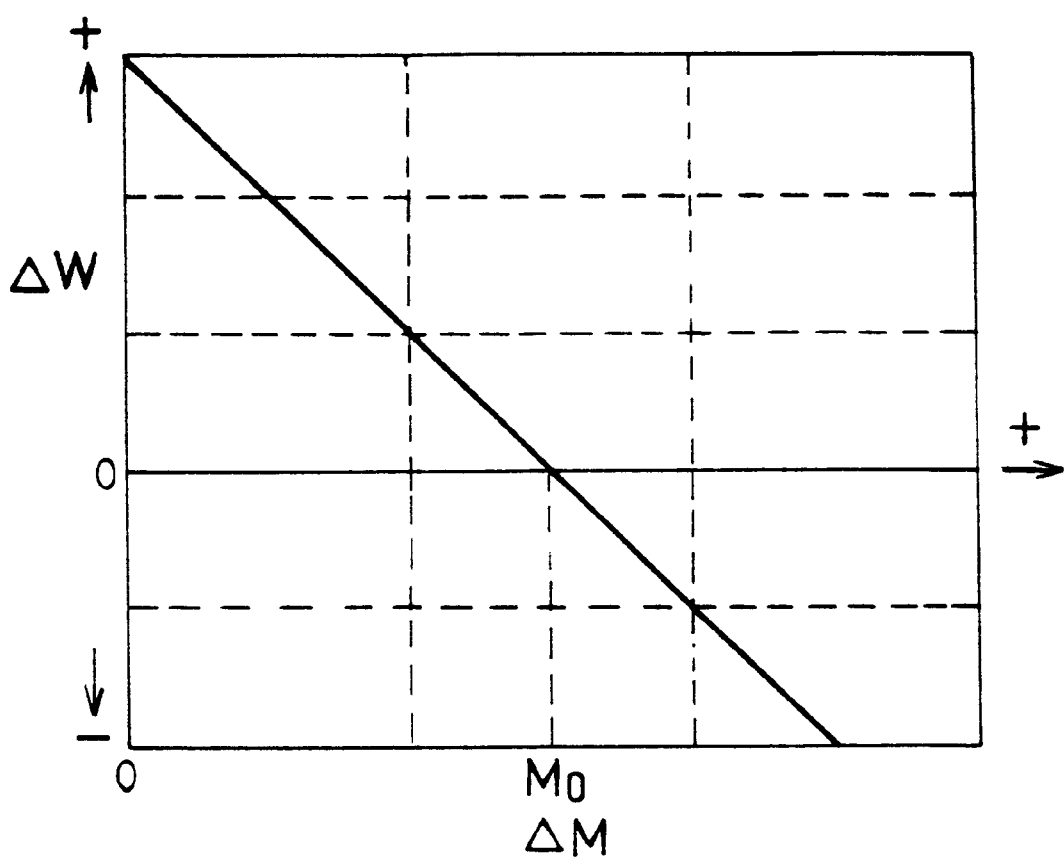
FIG. 7 is a graph showing a relation of a reduced width ΔM of the exposure pattern and a shift width ΔW of the resist pattern in the photomasks of FIGS. 5(a) and 5(b) and FIGS. 6(a) and 6(b).

For example, as shown in the graph of FIG. 7, showing the relation between the shift width $\Delta W$ and reduced width $\Delta M$, if exposure is effected with the exposure pattern (see FIG. 5(a)) having the reduced width $\Delta M=0$, then the shift width $\Delta W$ of the through hole area 23 reaches its maximum (see FIG. 5(b)). Thus, by gradually increasing the reduced width $\Delta M$, we reach a point $M_0$ at which the shift width $\Delta W$ is reduced to 0 (zero). Thus, by using the exposure pattern (see FIG. 6(a)) with the reduced width $\Delta M=M_0$, the through hole 61 can be formed adequately (see FIG. 6(b)). It should be noted, however, that the reduced width $\Delta M=M_0$ varies from time to time depending on the light source of the exposure device, transmittivity of the transflecting portion 12 and that of the transmitting portion 11 in the photomask 1.

Next, the following will explain the method of manufacturing the above-mentioned photomask 1 of the present invention.

The manufacturing method of the photomask 1 involves at least five processes: a double-layer film forming process, an exposure process, a double-layer film removing process, a resist removing process, and a blocking film removing process.

Figure 8:
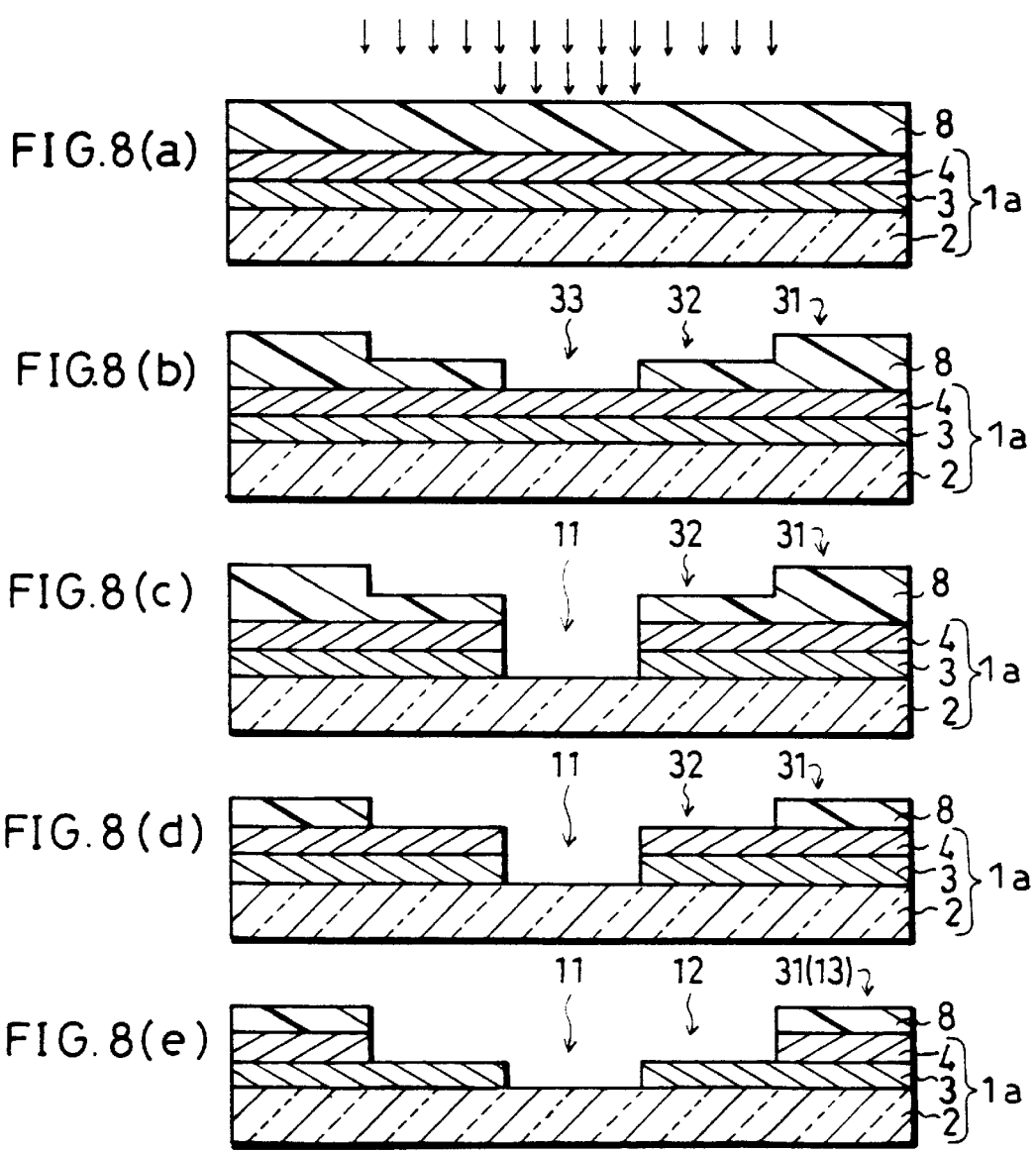
FIGS. 8(a) through 8(e) are views explaining a procedure along which the photomask of FIG. 1(a) is manufactured.

Initially, the translucent film 3 is formed over the transparent substrate 2, and the blocking film 4 is formed over the translucent film 3. In other words, by forming a double-layer film having the translucent film 3 and blocking film 4 over the transparent substrate 2, a triple-layer structure 1a as shown in FIG. 8(a) is obtained (double-layer film forming process).

Materials for the translucent film 3 are not especially limited as long as desired transmittivity is attained. However, preferable materials are oxide, nitride, oxygen nitride of silicide, and more preferable materials are oxide, nitride, and oxygen nitride of molybdenum silicide (MoSi), namely $MoSiO_x$, $MoSiN_y$, and $MoSiO_xN_y$, respectively. Of all these examples, $MoSiO_xN_y$ is particularly preferable. In the foregoing chemical formulas, a capital letter X represents the number of oxygen atoms and a capital letter Y represents the number of nitrogen atoms, where X>0 and Y>0.

An example method of forming the translucent film 3 made of $MoSiO_xN_y$ ($MoSiO_xN_y$ film) is a reactive sputtering method conducted under gaseous atmosphere of an argon (Ar) gas, an oxygen ($O_2$) gas, and a nitrogen ($N_2$) gas.

When the $MoSiO_xN_y$ film is used as the translucent film 3, transmittivity and phase difference of the same with respect to the transparent substrate 2 can be controlled merely by changing the content ratio of oxygen (O) or nitrogen (N). Therefore, capital letters X and Y in the chemical formulas respectively representing the number of oxygen atoms and nitrogen atoms are not limited to specific values, and vary depending on transmittivity and phase difference.

With the $MoSiO_xN_y$ film, transmittivity and phase difference generally decrease with an increase of the content of O or N. Also, the phase difference and transmittivity vary concurrently in response to the film thickness of the $MoSiO_xN_y$ film. For this reason, the film thickness of the $MoSiO_xN_y$ film is also an important factor to be taken into consideration.

Transmittivity of the $MoSiO_xN_y$ film used as the translucent film 3 in the present embodiment is preferably in a range between 10% and 30%, and most preferably at or around 15% of transmittivity of the transparent substrate 2. Also, the phase difference of the translucent film 3 is preferably in a range between 50° and 70°, and most preferably at or around 60° with respect to the transparent substrate 2. The film thickness of the $MoSiO_xN_y$ film is preferably in a range between 500 Å and 700 Å, and most preferably at or around 600 Å. It should be noted, however, that the transmittivity, phase difference, and film thickness can be set arbitrarily depending on the light source of the exposure device and the kind of the resist 5 as previously mentioned.

Materials for the blocking film 4 are not especially limited as long as being a thin film with a blocking property. For example, chromium (Cr: in case of a 100 nm-thick film, optical density is approximately 3.0) is particularly preferable. The sputtering technique can be used as a preferable manufacturing method of the blocking film 4.

Next, as shown in FIG. 8(a), a resist 8 (for example, EB resist, commercially known as ZEP81OS of Nippon Zeon Co., Ltd., ) is applied over the triple-layer structure la in a desired thickness. The resist 8 and resist 5 may be made of the same material or different materials.

The thickness of the resist 8 is not especially limited. However, a preferable thickness is in a range between 4500 Å and 5500 Å. The resist 8 is exposed to electron beams (indicated by arrows in the drawing) at the areas corresponding to the transmitting portion 11 and transflecting portion 12 (exposure process). The area corresponding to the transmitting portion 11 is exposed to electron beams in such a manner that the resist 8 is completely removed therefrom when developed. The area corresponding to the transflecting portion 12 is exposed to electron beams in an adjusted exposure amount, so that the thickness of the resist 8 is reduced to approximately half the initial thickness when developed.

During exposure with electron beams, electron beams are scanned on the areas corresponding to the transmitting portion 11 and transflecting portion 12 on the same reference value. Therefore, the electron beams scan a target position with high accuracy. Thus, even if the area corresponding to the transflecting portion 12 is exposed to electron beams first, and thence the areas corresponding to the transmitting portion 11, the exposed positions are not shifted with respect to each other, thereby realizing desired exposure.

With the exposure to the electron beams, formed on the triple-layer structure 1a is a resist pattern shown in FIG. 8(b) having a residual area 31 where the resist 8 is left intact, a thin layer area 32 (corresponding to the transflecting portion 12) having a thinner layer thickness (approximately half the initial thickness, herein) than the initial thickness of the resist 8, and a removed area 33 (corresponding to the transmitting portion 11) from which the resist 8 is completely removed.

Then, as shown in FIG. 8(c), the blocking film 4 and translucent film 3 in the removed area 33 are removed by means of etching so as to let the transparent substrate 2 be exposed, thereby forming the transmitting portion 11 (double-layer film removing process).

To be more specific, the blocking film 4 is removed by means of dry etching from the triple-layer structure la on which the resist pattern as shown in FIG. 8(b) has been formed. In case that the blocking film 4 is made of a chromium film, dry etching using a mixed gas of $O_2$ and $Cl_2$ or $CH_2Cl_2$ as an etching gas can be used suitably. Because the etching selectivity of the mixed gas with respect to the translucent film 3 ($MoSiO_xN_y$ film) provided underneath is sufficiently high, the mixed gas does not deteriorate the translucent film 3 at all.

After the blocking film 4 is removed, dry etching is applied to the translucent film 3. In this etching, the resist 8 and the blocking film 4 provided underneath in the residual area 31 serve as the mask. If the translucent film 3 is the $MoSiO_xN_y$ film and the blocking film 4 is the chromium film, then dry etching using a mixed gas of $CF_4$ and $O_2$ as an etching gas can be suitably applied. The selectivity of this mixed gas with respect to the resist 8 and blocking film 4 (chromium film) as the masking materials is satisfactory, thereby making it possible to remove the translucent film 3 alone effectively.

Further, as shown in FIG. 8(d), the resist 8 in the thin film area 32 is removed by means of ashing (resist removing process). Here, the $O_2$ plasma ashing method is preferably used.

Finally, as shown in FIG. 8(e), the blocking film 4 in the thin film area 32 is removed by means of etching so as to let the translucent film 3 be exposed, thereby forming the transflecting portion 12 (blocking film removing process). If the blocking film is the chromium film, the foregoing dry etching method can be suitably applied. Here, the resist 8 in the residual area 31 is removed to let the blocking film 4 be exposed, thereby forming the blocking portion 13. The photomask 1 of the present invention is manufactured by the procedure explained as above.

The size of the transmitting portion 11 is adjusted in consideration of the shift of exposure light at the time of exposure as discussed above. Transmittivity and phase difference of the translucent film 3 with respect to the transparent substrate 2 are determined when materials are selected.

The following will explain more detailed arrangements of the photomask 1 of the present invention by way of Example.

EXAMPLE

In the present example, a quartz substrate is used as the transparent substrate 2, on which the translucent film 3 made of oxygen nitride of molybdenum silicide ($MoSiO_xN_y$) is formed. Then, the blocking film 4 made of chromium (Cr) is formed on the translucent film 3. Subsequently, the photomask 1 of the present invention is manufactured by the above-explained method (see the manufacturing method of the photomask 1 shown in FIGS. 8(a) through 8(e)).

As has been discussed, transmittivity of the $MoSiO_xN_y$ film (translucent film) 3 serving as the transflecting portion 12 in the photomask 1 varies with the light source of the exposure device, the kind and layer thickness of the resist 5. Thus, by controlling the content of each gas during the reactive sputtering, transmittivity (absorption coefficient of exposure light) and phase difference (refractive index) of the $MoSiO_xN_y$ film are set to desired values by changing the content of O or N in the $MoSiO_xN_y$ film.

In the present example, 600 Å is given as the film thickness of the translucent film 3 ($MoSiO_xN_y$ film) in the transflecting portion 12, and by changing the content of o or N when the translucent film 3 is formed, approximately 15% of transmittivity of the transparent substrate 2 (transmitting portion 11) is given as the transmittivity of the translucent film 3, while approximately 60° is given as the phase difference with respect to the transparent substrate 2.

Figure 9:
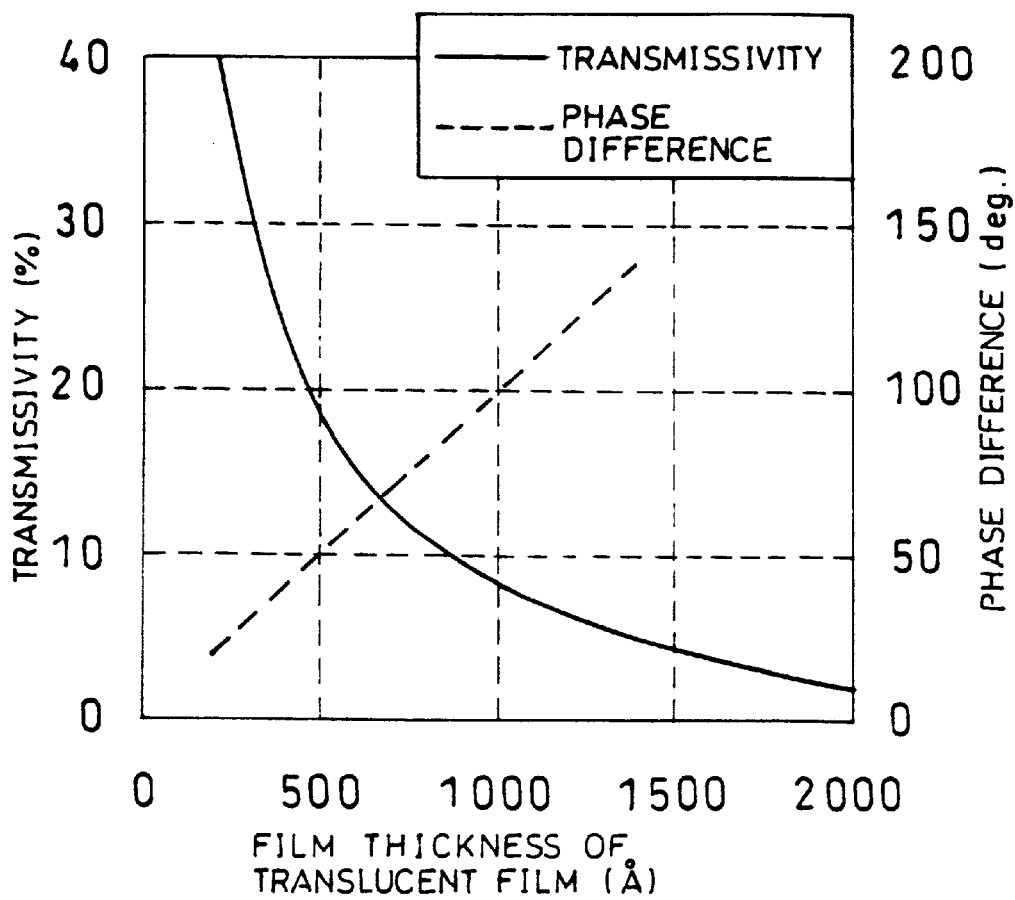
FIG. 9 is a graph showing a relation of transmittivity, a phase difference, a film thickness of a transflecting portion in the photomask of FIG. 1(a).
Figure 11A:
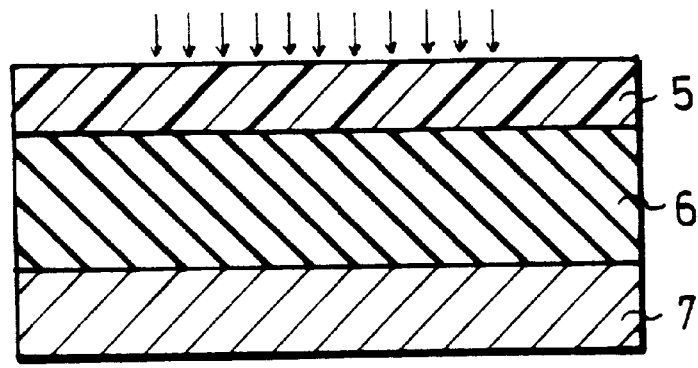
FIGS. 11(a) through 11(d) are views explaining a procedure along which a through hole and a step-wise shape are formed in the inter-layer insulating film by a conventional photomask.
Figure 11B:
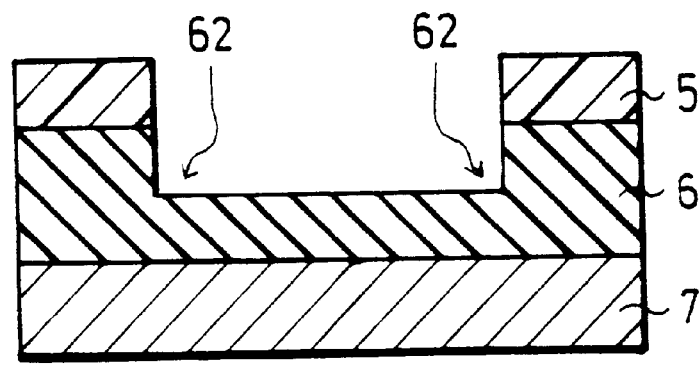
Figure 11C:
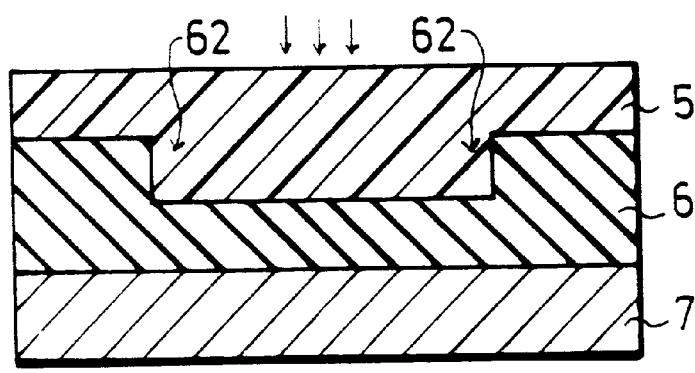
Figure 11D:
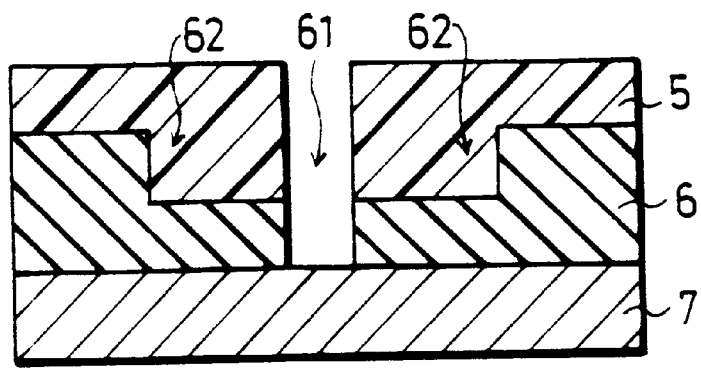
Figure 12A:
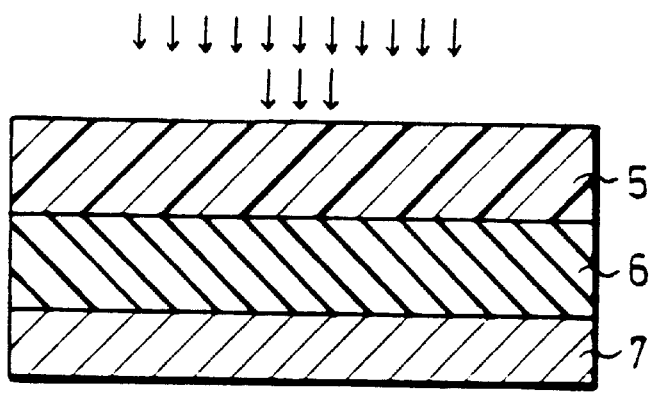
FIGS. 12(a) through 12(e) are views explaining another procedure along which a through hole and a stepwise shape are formed in the inter-layer insulating film by a conventional photomask.
Figure 12B:
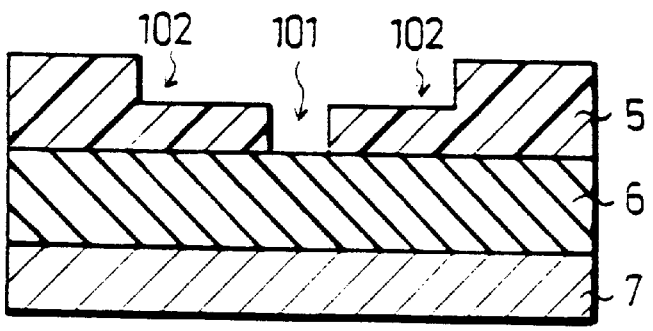
Figure 12C:
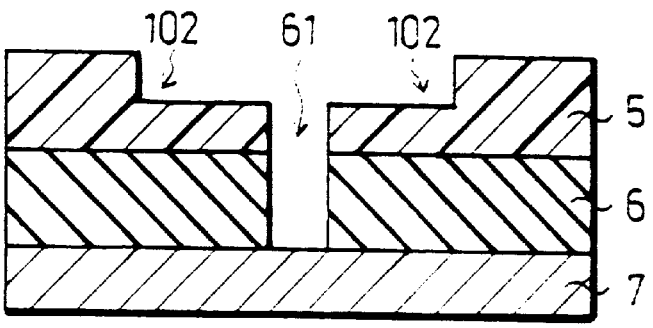
Figure 12D:
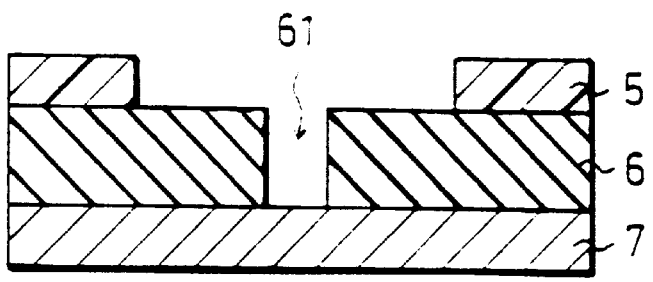
Figure 12E:
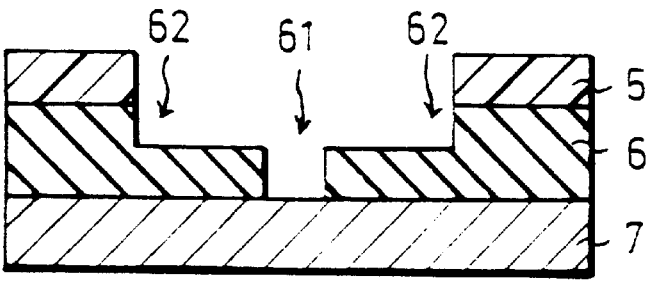

The relation between the film thickness and transmittivity or phase difference of the translucent film 3 ($MoSiO_xN_y$ film) is shown in the graph of FIG. 9. Transmittivity (%) or phase difference (deg.=°) of the translucent film 3 is used as the ordinate and the film thickness (Å) of the same is used as the abscissa. This graph shows dependency of transmittivity and phase difference versus the film thickness of the translucent film 3 with a KrF excimer laser. The phase difference (broken line) increases in proportion to the film thickness of the translucent film 3. On the other hand, transmittivity (solid line) increases as the film thickness of the translucent film 3 decreases, and approximates to 0 (zero) as the film thickness increases. In short, the transmittivity varies in inverse proportion to the film thickness of the translucent film 3.

In this graph, the particularly preferable transmittivity and phase difference are at or around the intersection of the phase difference indicated by a broken line and the transmittivity indicated by a solid line. Thus, in case that the KrF excimer laser is used as the light source of the exposure device and the corresponding resist 5 is used, transmittivity of the translucent film 3 ($MoSiO_xN_y$ film) is preferably in a range between 10% and 30% and most preferably at or around 15%. Likewise, the phase difference is preferably in a range between 50° and 70°, and most preferably at or around 60°.

As can be understood from FIG. 9, the film thickness of the translucent film 3 is preferably in a range between 500 Å and 700 Å, and most preferably at or around 600 Å.

The photomask 1 having the translucent film 3 that satisfies the foregoing conditions has optical performance such that can form the step-wise shape 62 as desired in the inter-layer insulating film 6 in a satisfactory manner.

Here, if approximately 15% of the transmittivity of the transmitting portion 11 is given as the transmittivity of the transflecting portion 12, then light intensity distribution of the exposure light exiting from the photomask 1 and irradiated on the wafer is shown in FIGS. 10(a) through 10(f). In these drawings, intensity of exposure light is indicated by a contour line, and the basic area 21, half area 22, and through hole area 23 on the wafer are schematically shown in the same manner as FIG. 5(a). For ease of explanation, only the half portion in the left of FIG. 5(a) is shown in FIGS. 10(a) through 10(f).

Also, the line width of the half area 22 indicated by a capital letter A is 0.25 $\mu$m, the size of the through hole area 23 is 0.25 $\mu$m×0.25 $\mu$m, a wavelength of exposure light is 248 nm, and a numerical aperture (NA) of optical system of the exposure device is 0.55.

The phase differences in FIGS. 10(a) through 10(f) are 50°, 60°, 70°, 80°, 100°, and 130°, respectively. As shown in FIG. 10(a), when 50° is given as the phase difference, then a portion $S_1$ appears, in which an area having strong light intensity in the half area 22 is slightly narrowed near the through hole area 23. Thus, if the phase difference is too small, the light intensity becomes too strong, and an unwanted portion such as $S_1$, appears, thereby making it difficult to pattern the resist 5 into a desired shape.

On the other hand, as shown in FIGS. 10(c) through 10(f), when the phase difference exceeds 70°, then an unwanted portion $S_2$ appears as well, in which the exposure light is irradiated to the half area 22 at a larger area near the through hole area 23. In particular, as shown in FIGS. 10(e) and 10(f), the greater the phase difference, the larger the portion $S_2$, and an discontinuous area $S_3$ appears between the $S_2$ and the through hole area 23, to which the exposure light is not irradiated.

Thus, if the phase difference is too large, then unwanted portions such as $S_2$ and $S_3$ appear. Here, $S_2$ corresponds to the secondary peak $P_1$ at which the resist loss 54 is produced as explained with reference to FIGS. 4(b) through 4(d), and $S_3$ corresponds to the point $P_0$ at which the resist residue 53 is produced as explained with reference to FIGS. 4(b) through 4(d). For these reasons, if a too large phase difference is given, unwanted irregularities are formed on the resist 5.

To eliminate this problem, as shown in FIG. 10(b), if 60° is given as the phase difference, $S_1$, through $S_3$ do not appear with the exposure light. In other words, no discontinuous portion appears on the light intensity of the exposure light, and light intensity varies gradually. Thus, when the resist 5 is exposed to light, the production of the resist residue 53 or resist loss 54 can be prevented.

From the foregoing, it is understood that when the $MoSiO_xN_y$, film is used as the translucent film 3 in the transflecting portion 12, if the film thickness is approximately 600 Å and the transmittivity is approximately 15% of that of the transmitting portion 11, then a suitable phase difference of the transflecting portion 12 with respect to the transmitting portion 11 is approximately 60°.

Thus, with the photomask 1 of the present invention with adequately designed phase difference, the resist 5 having the accurate resist step 52 without unwanted irregularities as shown in FIG. 1(c) and 1(d) can be obtained even if the exposure pattern is minute. Consequently, by repeating the procedures shown in FIGS. 3(c) through 3(e), the step-wise shape 62 can be formed in the inter-layer insulting film 6 with high accuracy.

Figure 2:
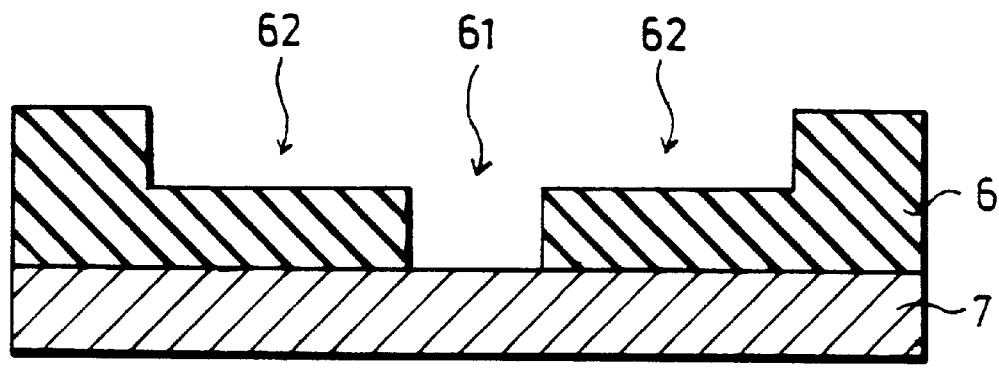
FIG. 2(*a*) is a cross section showing an arrangement of an inter-layer insulating film formed by the photomask of FIG. 1(*a*)
Figure 2:
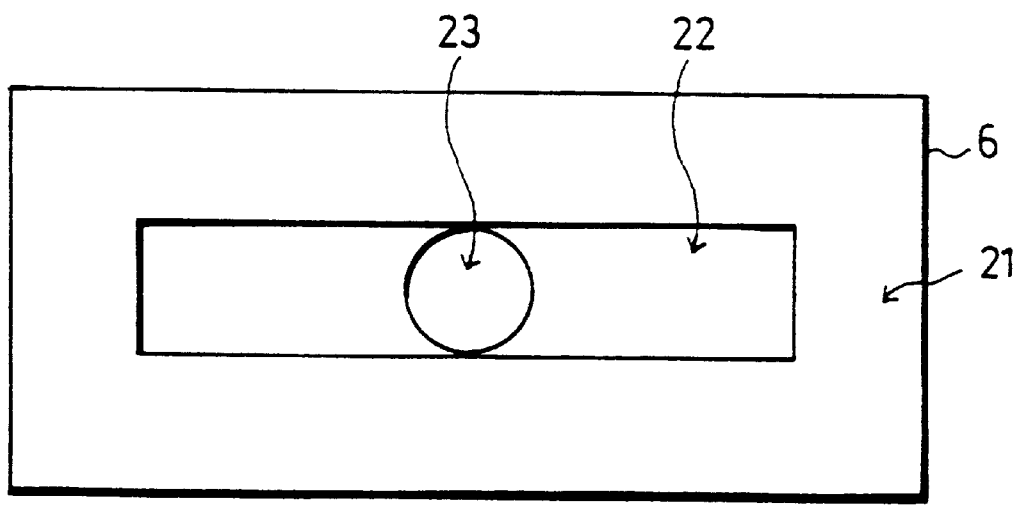

If a copper (Cu) layer or the like is formed by means of CVD (Chemical Vapor Deposition) over the inter-layer insulating film 6 which has been formed as shown in FIG. 2 by means of exposure and development using the photomask 1, and subsequently CMP (Chemical Mechanical Polishing) treatment is applied once, a junction with the bottom wire layer 7 and the embedding wire of the top layer are formed concurrently.

In the present invention, in forming the resist step by using the photomask, transmittivity of the transflecting portion is set so as to attain light intensity that reduces the film thickness approximately to half the initial thickness. It should be noted, however, that the photomask and the exposure method using the photomask of the present invention are not limited to the foregoing exposure. For example, the photomask and exposure method of the present invention may be suitably used when exposure with different light intensity is effected once.

The photomask of the present invention is a photomask used to expose a specific pattern, having a transmitting portion which transmits exposure light, a blocking portion which substantially blocks exposure light, and a transflecting portion which is given with transmittivity lower than that of the transmitting portion, which may be arranged in such a manner that the transflecting portion sets a phase difference with respect to the transmitting portion so that interference of exposure light exiting from the transflecting portion with exposure light exiting from the transmitting portion is suppressed.

According to the above arrangement, not only the transmittivity but also the phase difference of the transflecting portion with respect to the transmitting portion are taken into consideration. Thus, interference of exposure light exiting from the transmitting portion with exposure light exiting from the transflecting portion is suppressed. Consequently, significant change in transmittivity does not occur at any point in the transflecting portion, and adequate light intensity can be realized across the transflecting portion.

Thus, when the resist is exposed to light and developed through the photomask, a desired resist pattern can be formed in a reliable manner, because the resist residue and resist loss are hardly produced. Thus, the resist step having an area in which the film thickness is approximately half the initial thickness can be formed efficiently in a reliable manner, for example.

Because the resist step is formed reliably, the step-wise shape can be readily formed as desired in a reliable manner in the inter-layer insulating film of the semiconductor element by applying the etching treatment and ashing treatment. Thus, in manufacturing the semiconductor element, further minute through hole or wire groove can be formed in the inter-layer insulating film more efficiently.

The photomask of the present invention may be arranged in such a manner that the shape of the transmitting portion is modified in accordance with shift of the exposure light exiting form the transmitting portion, which is caused by a transmittivity difference between the transmitting portion and transflecting portion.

If the transmittivity of the transmitting portion and that of the transflecting portion are different, then exposure light exiting from the transmitting portion shifts in such a manner that the irradiation area will be enlarged in comparison with the exposure light exiting from the transflecting portion. To eliminate this problem, the above arrangement is given to modify the shape of the transmitting portion in accordance with the shift. Therefore, the shift caused at exposure can be eliminated, and the desired resist pattern can be formed in a more reliable manner.

The photomask of the present invention may be arranged in such a manner that the transflecting portion includes a translucent film made of oxygen nitride of silicide.

According to the above arrangement, because the translucent film made of oxygen nitride of silicide is used in the transflecting portion, transmittivity and phase difference of the transflecting film can be varied by changing the content of oxygen or nitrogen. Thus, the transmittivity and phase difference in the transflecting portion can be readily controlled.

The photomask of the present invention may be arranged in such a manner that, given that transmittivity of the transflecting portion is in a range between 10% and 30% of that of the transmitting portion, then the phase difference of the transflecting portion with respect to the transmitting portion is in a range between 50° and 70°.

According to the above arrangement, in case that oxygen nitride of silicide is used in the transflecting portion and the transmittivity and phase difference are in the above-specified ranges, then interference of light caused in the transflecting portion can be suppressed more effectively. Accordingly, a desired resist pattern can be formed in a more reliable manner.

The manufacturing method of the photomask of the present invention may include:
 a double-layer film forming process of forming a translucent film on a transparent substrate and forming a blocking film on the translucent film, transmittivity of the translucent film being smaller than transmittivity of the transparent substrate;
 an exposure process of forming a resist over the blocking film, and exposing the resist to electron beams;
 a double-layer film removing process of removing the translucent film and blocking film from an area where the resist has been removed in the exposure process;
 a resist removing process of removing the resist from a thin film layer area which is an area formed on the resist in the exposure process to have a thinner layer thickness than an initial thickness of the resist; and
 a blocking film removing process of removing the blocking film from the thin film area from which the resist has been removed.

According to the above method, because the double-layer film having the transflecting film and blocking film is formed on the transparent substrate, the above-described photomask is readily formed. Also, because the translucent film and blocking film are patterned by means of the resist, a desired exposure pattern can be formed in the photomask efficiently in a reliable manner.

The exposure method of the present invention may form a step with different film thickness in the resist by exposing a layer of resist with the photomask.

According to the above method, for example, the resist pattern having a step can be formed in a reliable manner by effecting exposure only once. Thus, the exposure process can be simplified and the manufacturing procedure of the semiconductor element involving such exposure can be simplified as well.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:
1. A photomask including:
 a high transmitting portion which transmits light to reach a resist; and
 a low transmitting portion having a transmittivity lower than a transmittivity of said high transmitting portion, said low transmitting portion being arranged so as to generate a phase difference between light exiting from said high transmitting portion and light exiting from said low transmitting portion such that interference of light therebetween causes substantially no change in light intensity near a boundary between said high transmitting portion and said low transmitting portion.

2. The photomask of claim 1, wherein a refractive index and a film thickness of said low transmitting portion are arranged so as to generate a phase difference between light exiting from said high transmitting portion and light exiting from said low transmitting portion such that interference of light therebetween causes substantially no change in light intensity near a boundary between said high transmitting portion and said low transmitting portion.

3. The photomask of claim 1, wherein a shape of said high transmitting portion is modified in accordance with a shift of light exiting from said high transmitting portion, which is caused by a difference in the transmittivity between said high transmitting portion and said low transmitting portion.

4. The photomask of claim 1, wherein said low transmitting portion includes a translucent film made of oxide, nitride, or oxygen nitride of silicide.

5. The photomask of claim 4, wherein, given that the transmittivity of said low transmitting portion is in a range between 10% and 30% of the transmittivity of said high transmitting portion, then the phase difference between light exiting from said high transmitting portion and light exiting from said low transmitting portion is in a range between 50° and 70°.

6. A photomask used to expose a predetermined pattern to light, having a transmitting portion which transmits exposure light, a blocking portion which substantially blocks exposure light, and a transflecting portion which has a transmittivity lower than a transmittivity of said transmitting portion,
    said transflecting portion having a phase difference with respect to said transmitting portion such that interference of exposure light exiting from said transflecting portion with exposure light exiting from said transmitting portion causes substantially no change in light intensity near a boundary between said transmitting portion and said transflecting portion.

7. The photomask of claim 6, wherein a shape of said transmitting portion is modified in accordance with a shift of exposure light exiting from said transmitting portion, which is caused by a difference in the transmittivity between said transmitting portion and said transflecting portion.

8. The photomask of claim 6, wherein said transflecting portion includes a translucent film made of oxide, nitride, or oxygen nitride of silicide.

9. The photomask of claim 8, wherein, given that the transmittivity of said transflecting portion is in a range between 10% and 30% of the transmittivity of said transmitting portion, then a phase difference of said transflecting portion with respect to said transmitting portion is in a range between 50° and 70°.

10. A method of manufacturing a photomask comprising:
    a step (a) of forming a low transmitting film on a high transmitting substrate, a transmittivity of said low transmitting film being lower than a transmittivity of said high transmitting substrate; and
    a step (b) of removing a part of said low transmitting film to let said high transmitting substrate be exposed, thereby forming a high transmitting portion,
        said low transmitting film being formed in said step (a) so as to generate a phase difference such that interference between light exiting from said high transmitting portion and light exiting from said low transmitting film causes substantially no change in light intensity near a boundary between said high transmitting portion and said low transmitting film.

11. The method of manufacturing a photomask of claim 10, further comprising:
    a step (c) of forming a blocking film on said low transmitting film;
    a step (d) of forming a resist on said blocking film;
    a step (e) of exposing said resist to electron beams; and
    a step (f) of removing a part of said resist and blocking film to let said low transmitting film be exposed.

12. A method of manufacturing a photomask, comprising:
    a double-layer film forming process of forming a translucent film on a transparent substrate and forming a blocking film on said translucent film, a transmittivity of said translucent film being smaller than a transmittivity of said transparent substrate;
    an exposure process of forming a layer of resist on said blocking film and exposing said resist to electron beams;
    a double-layer film removing process of removing said translucent film and blocking film from an area in which said resist has been removed in said exposure process;
    a resist removing process of removing said resist from a thin film layer area which is an area formed on said resist in said exposure process to have a thinner layer thickness than an initial thickness of said resist; and
    a blocking film removing process of removing a blocking film from said thin film layer area in which said resist has been removed.

13. A method of exposing a resist to light using a photomask including:
    a high transmitting portion which transmits light to reach a resist; and
    a low transmitting portion having a transmittivity lower than a transmittivity of said high transmitting portion,
        said low transmitting portion being arranged so as to generate a phase difference such that interference between light exiting from said high transmitting portion and light exiting from said low transmitting portion causes substantially no change in light intensity near a boundary between said high transmitting portion and said low transmitting portion.

14. A method of exposing a layer of resist to light through a photomask used to expose a predetermined pattern, so that a step having different layer thicknesses is formed in said resist, said photomask including:
    a transmitting portion which transmits exposure light;
    a blocking portion which substantially blocks exposure light; and
    a transflecting portion having a transmittivity lower than a transmittivity of said transmitting portion,
        said transflecting portion being arranged so as to generate a phase difference with respect to said transmitting portion such that interference of exposure light exiting from said transmitting portion and exposure light exiting from said transflecting portion causes substantially no change in light intensity near a boundary between said transmitting portion and said transflecting portion.

15. A photomask for transfer of a pattern onto a light-sensitive material in which a full-thickness region, a reduced-thickness region having a thickness less than the thickness of the full-thickness region, and a through-hole are to be formed, the photomask comprising:

a transmitting portion corresponding to the through-hole and which transmits exposure light at first transmittivity;

a transflecting portion corresponding to the reduced-thickness region and which transmits the exposure light at a second transmittivity less than the first transmittivity; and a blocking portion corresponding to the full-thickness region and which blocks the exposure light, wherein a phase difference of the transflecting portion with respect to the transmitting portion suppresses interference between the exposure light exiting from the transflecting portion and the exposure light exiting from the transmitting portion so that a light intensity difference across the transflecting portion is almost zero.

16. The photomask of claim 15, wherein the light-sensitive material comprises a photoresist.

17. The photomask of claim 15, wherein the transflecting portion comprises an oxygen nitride of molybdenum silicide.

18. The photomask of claim 15, wherein the transmittivity of the transflecting portion is between about 10% and 30% of the transmittivity of the transmitting portion.

19. The photomask of claim 18, wherein the transmittivity of the transflecting portion is at or around 15% of the transmittivity of the transmitting portion.

20. The photomask of claim 15, wherein the phase difference of the transflecting portion with respect to the transmitting portion is in a range between 50° and 70°.

21. The photomask of claim 20, wherein the phase difference of the transflecting portion with respect to the transmitting portion is at or around 60°.

22. The photomask of claim 15, wherein the transmittivity of the transflecting portion is between about 10% and 30% of the transmittivity of the transmitting portion and the phase difference of the transflecting portion with respect to the transmitting portion is in a range between 50° and 70°.

* * * * *